United States Patent
Choi et al.

(10) Patent No.: US 9,627,092 B2
(45) Date of Patent: Apr. 18, 2017

(54) SEMICONDUCTOR DEVICE PERFORMING ERROR CORRECTION OPERATION

(71) Applicant: SK hynix Inc., Icheon-si, Gyeonggi-do (KR)

(72) Inventors: Won-Ha Choi, Icheon-si (KR); Seung-Min Lee, Seoul (KR)

(73) Assignee: SK hynix Inc., Icheon-Si (KR)

(*) Notice: Subject to any disclaimer, the term of this patent is extended or adjusted under 35 U.S.C. 154(b) by 212 days.

(21) Appl. No.: 14/540,694

(22) Filed: Nov. 13, 2014

(65) Prior Publication Data

US 2015/0212879 A1    Jul. 30, 2015

(30) Foreign Application Priority Data

Jan. 29, 2014 (KR) .................. 10-2014-0011037

(51) Int. Cl.
*H03M 13/00* (2006.01)
*G11C 29/52* (2006.01)
*G06F 11/10* (2006.01)
*G11C 29/04* (2006.01)

(52) U.S. Cl.
CPC .......... *G11C 29/52* (2013.01); *G06F 11/1008* (2013.01); *G11C 2029/0411* (2013.01)

(58) Field of Classification Search
CPC ............. G11C 29/52; G11C 2029/0411; G06F 11/1008
See application file for complete search history.

(56) References Cited

U.S. PATENT DOCUMENTS

| 2006/0123320 A1* | 6/2006 | Vogt | G11C 5/04 714/762 |
| 2008/0072120 A1* | 3/2008 | Radke | G06F 11/1068 714/768 |
| 2010/0332952 A1* | 12/2010 | Chung | G06F 11/1068 714/773 |

FOREIGN PATENT DOCUMENTS

KR    1020130116171 A    10/2013

OTHER PUBLICATIONS

"Low Power Double Data Rate 4 (LPDDR4)", JEDEC Standard No. 209-4A, Nov. 2015, pp. 1-266.

* cited by examiner

*Primary Examiner* — Guy Lamarre
(74) *Attorney, Agent, or Firm* — William Park & Associates Ltd.

(57) ABSTRACT

A semiconductor device may include a memory core including a data cell region and a parity cell region, a parity calculation logic configured for generating a parity from data received by the parity calculation logic, and an error correcting logic configured for outputting error-corrected data by using data that is output from the data cell region and a parity that is output from the parity cell region.

14 Claims, 5 Drawing Sheets

SEMICONDUCTOR DEVICE PERFORMING ERROR CORRECTION OPERATION

The present application claims priority under 35 U.S.C. §119(a) to Korean application number 10-2014-0011037, filed on Jan. 29, 2014, in the Korean Intellectual Property Office, which is incorporated herein by reference in its entirety as set forth in full.

BACKGROUND

1. Technical Field

Various embodiments generally relate to a semiconductor device including memory cells. Particularly, the various embodiments relate to a semiconductor device capable of performing an error correction operation therein.

2. Related Art

In a conventional semiconductor memory devices error correction operations may be performed. For example, devices, such as a memory controller performing no error correction therein and controlling the semiconductor memory device, or a CPU, have performed an error correction operation.

An error correction block included in the memory controller performs an error correction operation in units of a plurality of semiconductor memory devices connected through a memory channel. As such, the error correction block included in the memory controller does not perform the error correction operation in units of individual semiconductor memory devices.

Recently, as the cell size of a semiconductor memory device is reduced, the probability of error occurrence is increased. Therefore, when an error correction operation is performed only in units of memory controllers, there is a problem that the probability of fail may increase due to errors that occur in a plurality of semiconductor memory devices connected to a memory channel.

SUMMARY

In an embodiment, a semiconductor device may include a memory core including a data cell region and a parity cell region, and a parity calculation logic configured for generating a parity from data received by the parity calculation logic. The semiconductor device may include an error correcting logic configured for outputting error-corrected data by using data that is output from the data cell region and a parity that is output from the parity cell region.

The semiconductor device according to an embodiment may include an internal command controller configured for receiving an external command and an external address and configured for outputting an internal command and an internal address for controlling the memory core.

In the semiconductor device according to an embodiment, a width of data input/output to the semiconductor device may be I (where I may be a natural number) and a width of data input to the parity calculation logic may be J (where J may be a natural number and J may be larger than or equal to I).

In the semiconductor device according to an embodiment, when a first read command and a first read address are received from outside the semiconductor device, the internal command controller may generate a first internal read command for reading a first parity, I-bit data corresponding to the first read address, and (J-I) bit-data used together with the I-bit data in order to generate the first parity.

In the semiconductor device according to an embodiment, when a first write command and a first write address are received from outside the semiconductor device, the internal command controller may generate a second internal read command for reading a second parity, I-bit data corresponding to the first write address, and (J-I) bit-data used together with the I-bit data in order to generate the second parity.

In the semiconductor device according to an embodiment, the error correcting logic may generate error-corrected J-bit data from the I-bit data, the (J-I) bit-data, and the second parity.

In the semiconductor device according to an embodiment, the parity calculation logic may generate third parity information from I-bit data received from outside the semiconductor device and (J-I) bit-data selected from the error-corrected J-bit data, in correspondence with the first write command.

In the semiconductor device according to an embodiment, the internal command controller may further generate an internal write command that writes the I-bit data received from outside the semiconductor device and the third parity information in the memory core.

A semiconductor device according to an embodiment may perform an error correction operation therein, thereby possibly reducing the probability of error occurrence in the semiconductor device. When a plurality of semiconductor devices according to an embodiment are connected to form a memory channel, an individual semiconductor device primarily may correct an error and a memory controller secondarily may correct an error with respect to data that is output from the memory channel, so that it may be possible to further reduce the probability of an error occurrence.

DETAILED DESCRIPTION

Hereinafter, a semiconductor device according to various embodiments will be described in detail with reference to the accompanying drawings through various examples of embodiments.

For example, a semiconductor device including memory cells and capable of performing an error correction operation therein may be described herein.

Figure 1:
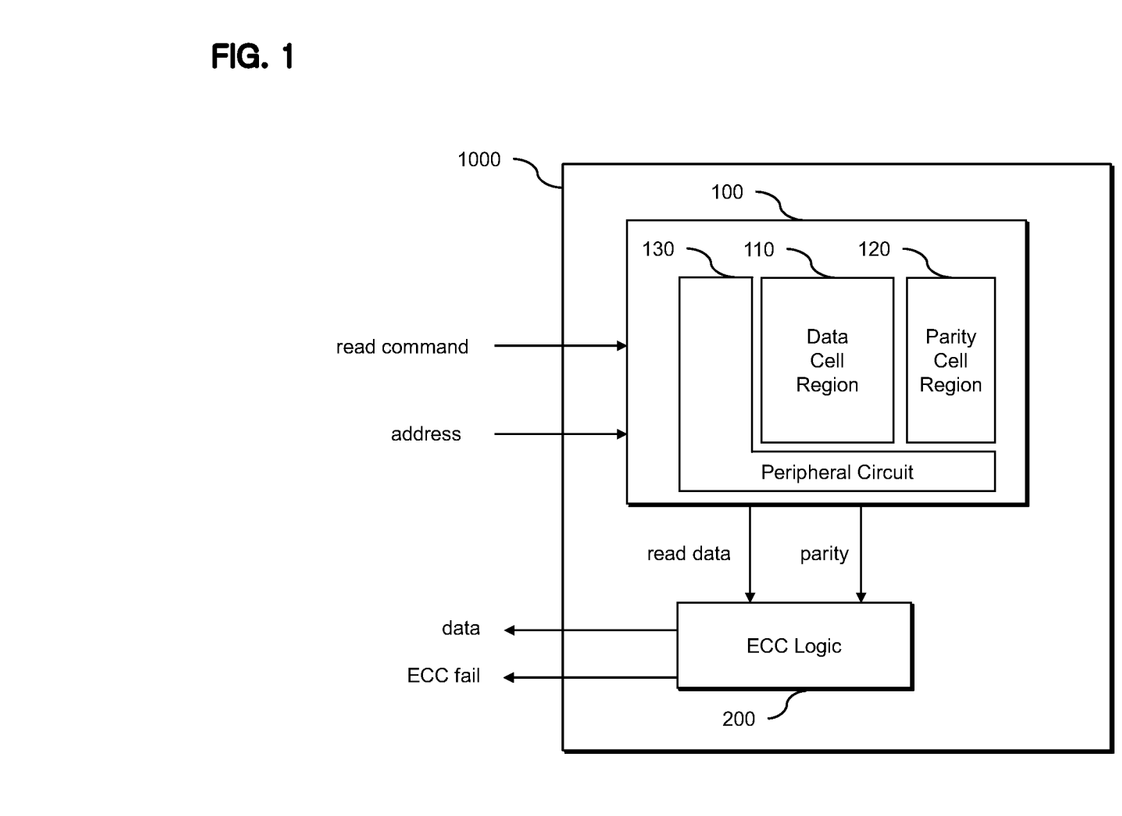
FIG. 1 is a block diagram representation for explaining a read operation of a semiconductor device according to an embodiment.

FIG. 1 is a block diagram representation illustrating a read operation of a semiconductor device 1000 according to an embodiment.

The semiconductor device 1000 according to an embodiment may include a memory core 100 and an ECC (Error Correcting Code) logic 200.

The memory core 100 may include a data cell region 110 that stores general data and a parity cell region 120 that stores a parity.

Since the data cell region 110 and the parity cell region 120 may be logically divided, the data cell region 110 and the parity cell region 120 may be physically positioned in a separate cell array or one cell array. For example, in a cell array of the semiconductor device, a predetermined address area may also be used as the data cell region and a remaining cell region may be used as the parity cell region.

The memory core 100 may include a peripheral circuit 130 that may perform a function of controlling the cell regions 110 and 120 according to a read/write command, and writing or outputting data.

The basic configuration and operation of the memory core 100 may be substantially the same as those of a cell region and a peripheral circuit for the cell region in a conventional semiconductor memory device. In an embodiment the operations of the parity cell region and the peripheral circuit for the parity cell region may be added. In an embodiment the basic cell structure and the control operation for the cell structure may be the same as those of the conventional semiconductor memory device. Accordingly, a description of the detailed configuration of the memory core 100 will be omitted.

A read or write command input received from a device exterior to the semiconductor device 1000 may be generated by combining signals such as WE (Write Enable), RAS (Row Address Strobe), or CAS (Column Address Strobe) with one another. The memory core 100 is controlled by the read command and outputs a data signal and a parity signal. The data signal is output from the data cell region 110 and the parity signal is output from the parity cell region 120.

The ECC logic 200 analyzes the data signal. The ECC logic 200 analyzes the parity signal. When a correctable error is included in the data signal, the ECC logic 200 may correct the error and output an error-corrected signal. Otherwise, the ECC logic 200 may output a fail signal.

For example, when a single bit error is included in the data signal, the ECC logic 200 may correct the signal bit error and output an error-corrected signal. When a multi-bit error exists in the data signal, the ECC logic 200 may activate the fail signal.

When an error exists in data, each of a plurality of semiconductor devices 1000 may correct the error in advance and output error-corrected data, so that it is possible to reduce the probability of an error occurrence of an entire data included in a memory channel formed by collecting the plurality of semiconductor devices 1000.

Figure 2:
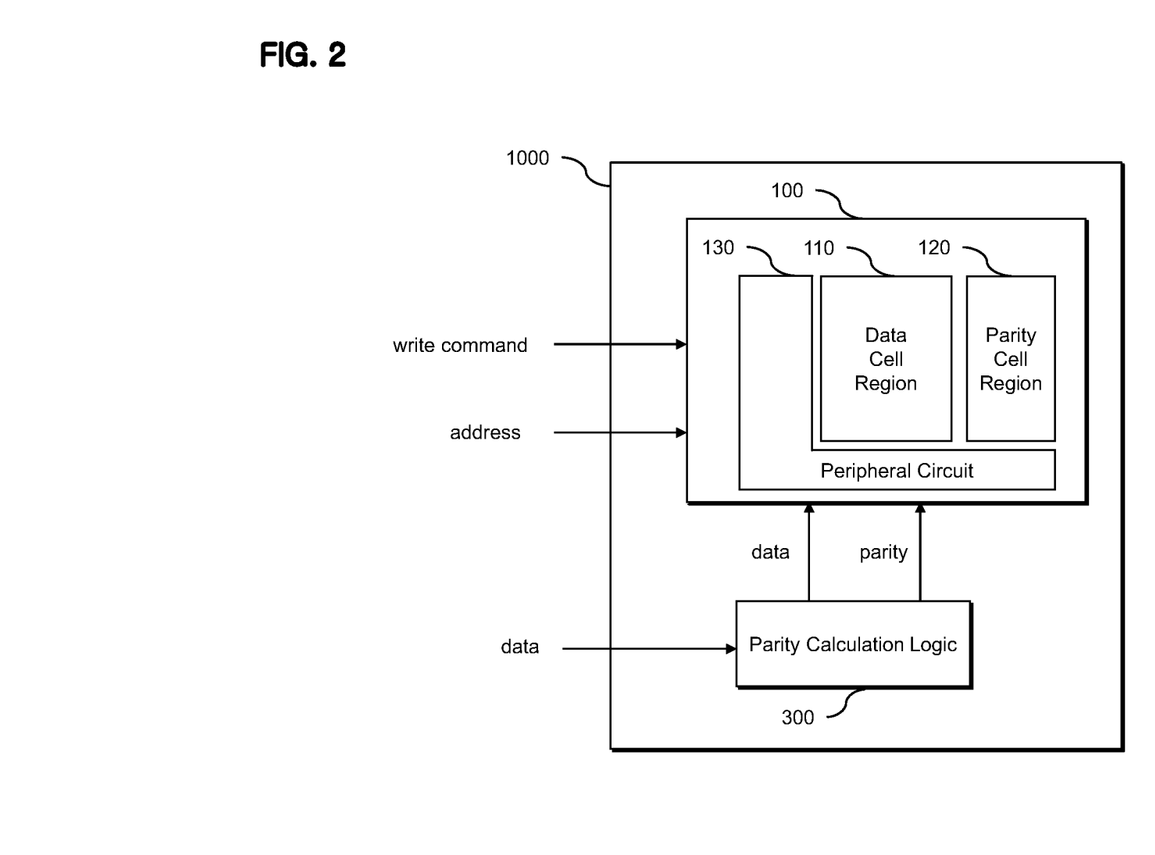
FIG. 2 is a block diagram representation for explaining a write operation of a semiconductor device according to an embodiment.

FIG. 2 is a block diagram representation for explaining a write operation of the semiconductor device 1000 according to an embodiment.

The semiconductor device 1000 according to an embodiment further may include a parity calculation logic 300 that generates a parity from data.

The parity calculation logic 300 may calculate a parity from data input to the semiconductor device 100 and may output the parity. For example but not limited to, the parity calculation logic 300 may calculate a parity by using a Hamming code.

The memory core 100 may store a data signal and a parity signal, which are output from the parity calculation logic 300, in the data cell region 110 and the parity cell region 120 according to a write command and an address.

The read operation of FIG. 1 and the write operation of FIG. 2 may be based on the assumption that the width of data input to the semiconductor device is equal to the width of data that is used for the parity generation.

However, when the semiconductor device is designed in this way, the size of the parity cell region is relatively increased as compared with the data cell region, resulting in perhaps the reduction of cell efficiency. For example, in the example of using the Hamming code, when the width of data is $2^n$, since the width of a required parity is (n+1), as the width of the data is small, the width of the parity is relatively increased.

Accordingly, when considering the cell efficiency, it may be necessary to consider a write operation when the width (J) of data required for parity generation is different from the width (I) of data that is input to the semiconductor device 1000.

Hereinafter, an embodiment in which the width (I) of data input/output to the semiconductor device 1000 is, for example, 32, the width (J) of data required for parity generation is, for example, 128, and the width of a parity corresponding to this is, for example, 8. FIG. 2 also illustrates a peripheral circuit 130 (i.e., see FIG. 1).

Figure 3:
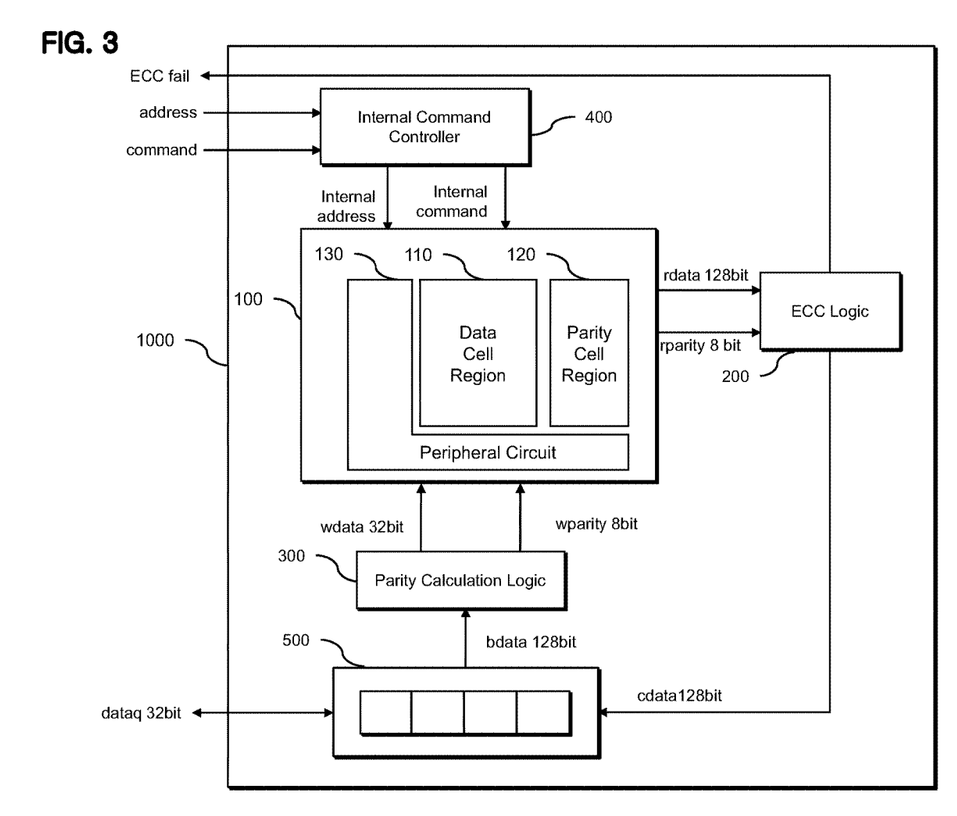
FIG. 3 is a block diagram of a representation of a semiconductor device according to an embodiment.

FIG. 3 is a block diagram of a representation of the semiconductor device 1000 according to an embodiment.

Referring to FIG. 3, operations of a memory core 100, an ECC logic 200, and a parity calculation logic 300 are substantially the same as the operations as described in FIG. 1 and FIG. 2.

The memory core 100 may include a data cell region 110 and a parity cell region 120, and may be designed such that one 8-bit parity data corresponds to each 128 bit-data of the data cell region 110.

Figure 4:
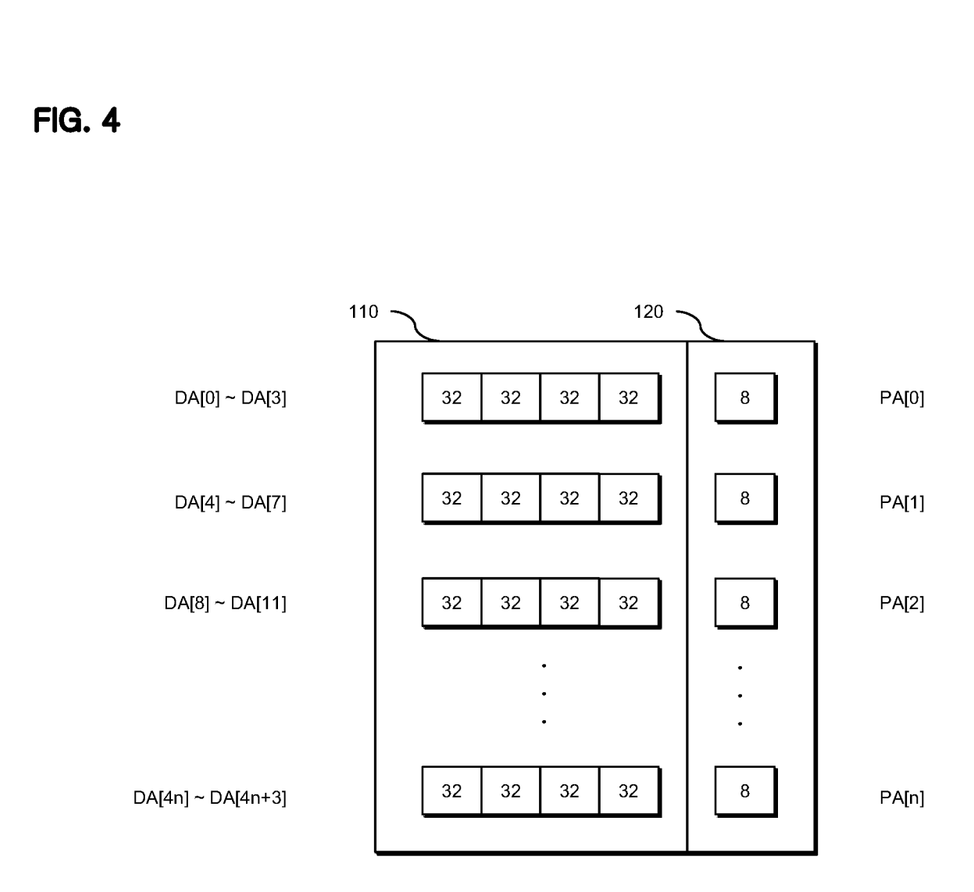
FIG. 4 is a block diagram of a representation of a data cell region and a parity cell region according to an embodiment.

FIG. 4 is a block diagram representation illustrating the relation between the data cell region 110 and the parity cell region 120 of FIG. 3.

FIG. 4 illustrates an example in which the data cell region 110 is formed in units of 32-bit data blocks.

In an embodiment, one 8-bit parity signal is generated for a 128-bit data signal obtained by combining the four 32-bit data blocks.

In the relation between the addresses of data blocks and the addresses of parity blocks, as illustrated in FIG. 4, a parity block with an address of PA[n] corresponds to data blocks with addresses of DA[4n] to DA[4n+3] (n is an integer larger than −1).

The relation between the addresses of the data blocks and the addresses of the parity blocks illustrated in FIG. 4 may be changed according to a scheme of deciding the address ranges of the data cell region 110 and the parity cell region 120, and this may be subject to various design changes by those skilled in the art.

The ECC logic 200 may decode the 128-bit data signal rdata output from the memory core 100 and the 8-bit parity signal rparity, and may correct an error of the data signal, thereby generating corrected 128-bit data cdata.

If a non-correctable error occurs, the ECC logic 200 may activate a fail signal ECC fail.

The parity calculation logic 300 may generate an 8-bit parity wparity from 128-bit data bdata. The parity calculation logic 300 may receive data from, for example, the data buffer 500.

The semiconductor device 1000 according to an embodiment may include an internal command controller 400. The internal command controller 400 may generate an internal command and an internal address from a command and an address that are input to the semiconductor device.

The internal command and the internal address are used to control an internal operation that is required by the difference between the width (32) of data dataq input/output to the semiconductor device 1000 and the width (128) of data used for parity generation.

The semiconductor device 1000 according to an embodiment may further include a data buffer 500. The data buffer 500 may include a space for temporarily storing the 128-bit data bdata required for parity generation, and a 32-bit storage space of this space may be used for temporal storage of the dataq.

First, a read operation will be described.

The semiconductor device 1000 may output 32-bit data dataq in correspondence with a read command and an address. In the semiconductor device 1000 according to an embodiment, since the width of data used for parity generation is 128, an additional read operation is required for an address other than an address requested to be read.

To this end, the read command and the address are provided to the internal command controller 400.

In an example pertaining to the read operation, in order to read 32-bit data corresponding to an input address, it is necessary to additionally read three 32-bit data blocks that share corresponding 32-bit data and parity information.

Referring to FIG. 4, in the example pertaining to generating one parity block with respect to four adjacent 32-bit data blocks, it is possible to mathematically calculate addresses of the other three data blocks corresponding to a data block of the input address.

For example, when an address of a block requested to be read is 4k+1 (k is an integer larger than −1), addresses of the other three blocks are 4k, 4k+2, and 4k+3.

Through such a principle, the internal command controller 400 may sequentially generate a read command for the four data blocks including the block requested to be read and a read command for parity blocks corresponding to them.

According to other embodiments, among the four data blocks and the parity blocks, when there are blocks that may be simultaneously read, read commands may be simultaneously provided to them.

A generation method of the internal command and the internal address may be changed according to a relation between a data processing unit of the semiconductor device 1000 and a data processing unit of the memory core 100.

For example, when the memory core 100 may input/output data in units of 128 bits, the internal command controller 400 may also generate an internal address and an internal read command for 128-bit data blocks including a 32-bit data block requested to be read.

In an example, when the memory core 100 may input/output data in units of 136 bits and four data blocks and one parity block are positioned in one row region, the internal command controller 400 may also generate an internal address and an internal read command for the four data blocks and the one parity block.

The 128-bit data signal rdata and the 8-bit parity signal rparity output by the internal read operation are provided to the ECC logic 200. The ECC logic 200 may generate corrected data cdata by using the 128-bit data signal rdata and the 8-bit parity signal rparity output by the internal read operation.

The ECC logic 200 may output 128-bit data. The 128-bit data may be stored in the data buffer 500. The data buffer 500 may output one 32-bit data block, which corresponds to the input address among the four stored 32-bit data blocks, to an exterior.

In an embodiment, the ECC logic 200 may also select and output only 32-bit data of the corrected signal cdata.

Next, a write operation will be described.

When a write command and a write address are input, the internal command controller 400 may generate an internal command and an internal address for reading 128-bit data, which may include 32-bit data blocks corresponding to the write address and 96-bit data blocks sharing parity data, and 8-bit parity blocks corresponding to the 128-bit data, and controls the memory core 100, similarly to the read operation.

Then, the ECC logic 200 may generate corrected 128-bit data cdata from the 128-bit data signal rdata and the 8-bit parity signal rparity.

The corrected 128-bit data cdata is output to the data buffer 500, and the data buffer 500 temporarily stores 96-bit data, except for a part corresponding to an address requested to be written, and 32-bit data dataq requested to be written.

In an embodiment, the ECC logic 200 may output only the 96-bit data of the corrected 128-bit data cdata, except for a part corresponding to an address requested to be written, and the output data may be directly provided to the parity calculation logic 300 together with the 32-bit data dataq requested to be written.

The parity calculation logic 300 may generate an 8-bit parity signal wparity from the combined 128-bit data bdata.

Then, the internal command controller 400 may generate an internal command for writing the 32-bit data wdata requested to be written of the combined data and the generated 8-bit parity signal in the data cell region 110 and the parity cell region 120 with respect to the address requested to be written.

As described above, a detailed generation method of the internal write command and the internal write address may be changed according to the data processing unit of the semiconductor device 1000 and the data processing unit of the memory core 100.

For example, when the memory core 100 may input/output data in units of 128 bits, the internal command controller 400 may generate an internal address and an internal command for writing the parity wparity together with an internal address for 128 bits, which is the combined data bdata, and a write command for the internal address.

For example, when the memory core 100 may input/output data in units of 136 bits, the internal command controller 400 may also generate an internal command and an internal address for simultaneously writing the combined data bdata and the parity wparity.

Other various generation methods of an internal command and an internal address may be derived, and may be included in the range of a design change of those skilled in the art.

The semiconductor devices discussed above (see FIGS. 1-4) are particular useful in the design of memory devices, processors, and computer systems. For example, referring to FIG. 5, a block diagram of a system employing the semiconductor devices in accordance with the embodiments are illustrated and generally designated by a reference numeral 4000. The system 4000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

Figure 5:
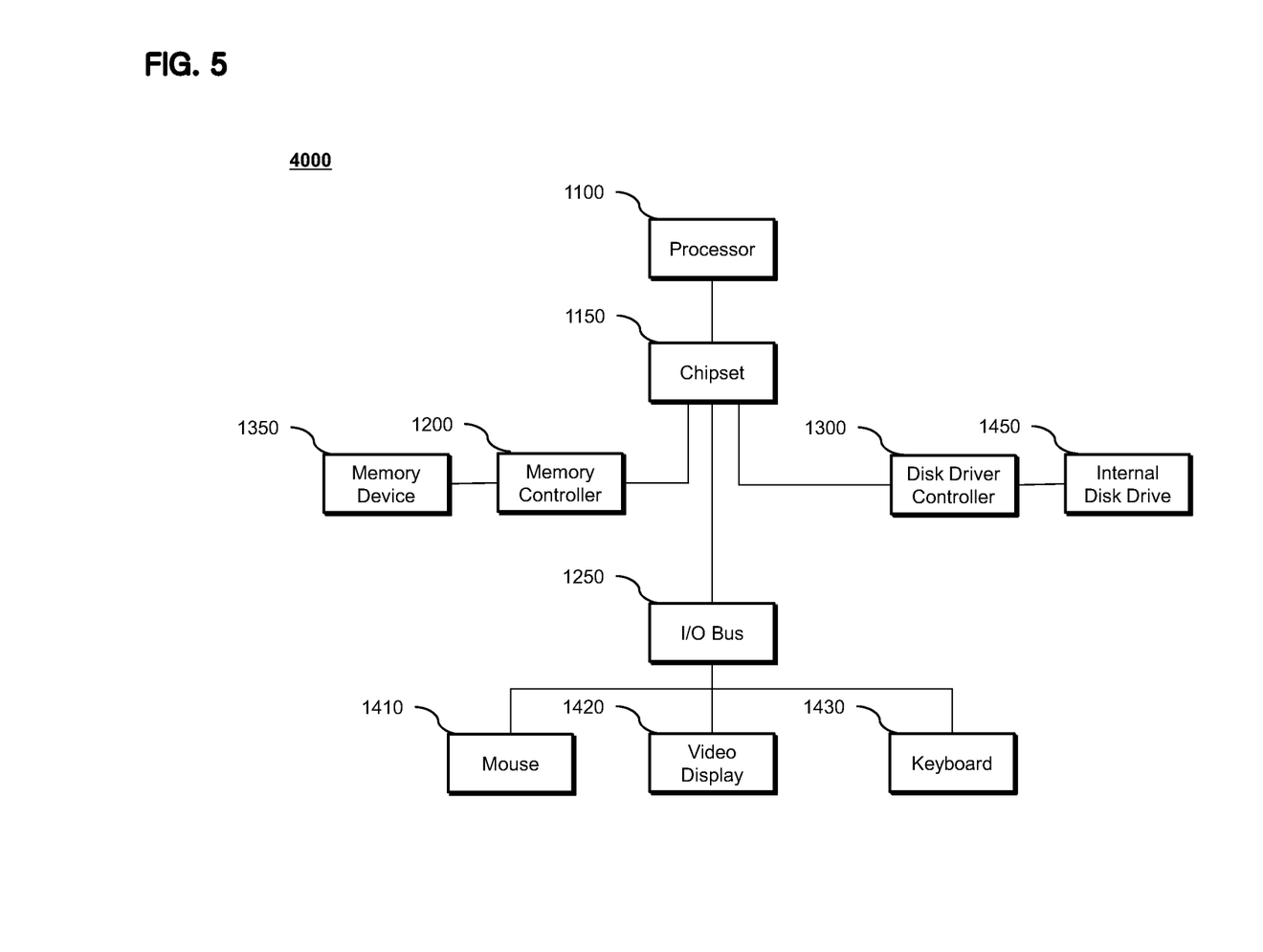
FIG. 5 illustrates a block diagram of an example of a representation of a system employing the semiconductor device in accordance with the embodiments discussed above with relation to FIGS. 1-4.

A chipset 1150 may be operably coupled to the CPU 1100. The chipset 1150 is a communication pathway for signals between the CPU 1100 and other components of the system 4000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 4000 can be readily adjusted without changing the underlying nature of the system.

As stated above, the memory controller 1200 may be operably coupled to the chipset 1150. The memory controller 1200 may include at least one semiconductor device as discussed above with reference to FIGS. 1-4. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device as discussed above with relation to FIGS. 1-4, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 4000 described above in relation to FIG. 5 is merely one example of a system employing the semiconductor device as discussed above with relation to FIGS. 1-4. In alternate embodiments, such as cellular phones or digital cameras, the components may differ from the embodiments illustrated in FIG. 5.

While certain embodiments have been described above, it will be understood to those skilled in the art that the embodiments described are by way of example only. Accordingly, the semiconductor device described herein should not be limited based on the described embodiments. Rather, the semiconductor device described herein should only be limited in light of the claims that follow when taken in conjunction with the above description and accompanying drawings.

What is claimed is:

1. A semiconductor device comprising:
   a memory core including a data cell region and a parity cell region;
   a parity calculation logic configured for generating a parity from data received by the parity calculation logic; and
   an error correcting logic configured for outputting error-corrected data by using data that is output from the data cell region and a parity that is output from the parity cell region; and
   wherein a size of a first data input to the semiconductor device by a write command to the semiconductor device or output from the semiconductor device by a read command to the semiconductor device is smaller than a size of a second data received by the parity calculation logic to generate a first parity, and
   wherein the second data includes the first data and a third data read from the data cell region before generating the first parity.

2. The semiconductor device according to claim 1, further comprising:
   an internal command controller configured for receiving an external command and an external address, and configured for outputting an internal command and an internal address for controlling the memory core.

3. The semiconductor device according to claim 2, wherein a width of data input/output to the semiconductor device is I and a width of data input to the parity calculation logic is J,
   wherein I is a natural number, and
   wherein J is a natural number and is larger than or equal to I.

4. The semiconductor device according to claim 3, wherein, when a first read command and a first read address are received from outside the semiconductor device, the internal command controller generates a first internal read command for reading the first parity, I-bit data corresponding to the first read address, and bit-data (J-I) used together with the I-bit data in order to generate the first parity.

5. The semiconductor device according to claim 4, wherein the first internal read command includes a 1-1 read command for the I-bit data, a 1-2 read command for the (J-I) bit, and a 1-3 read command for the first parity.

6. The semiconductor device according to claim 4, wherein the error correcting logic generates error-corrected J-bit data from the I-bit data, the (J-I) bit-data, and the first parity.

7. The semiconductor device according to claim 6, wherein the semiconductor device outputs I-bit data corresponding to the first read address, of the error-corrected J-bit data in correspondence with the first read command.

8. The semiconductor device according to claim 3, wherein, when a first write command and a first write address are received from outside the semiconductor device, the internal command controller generates a second internal read command for reading a second parity, I-bit data corresponding to the first write address, and (J-I) bit-data used together with the I-bit data in order to generate the second parity.

9. The semiconductor device according to claim 8, wherein the second internal read command includes a 2-1 read command for the I-bit data, a 2-2 read command for the (J-I) bit, and a 2-3 read command for reading the second parity.

10. The semiconductor device according to claim 8, wherein the error correcting logic generates error-corrected J-bit data from the I-bit data, the (J-I) bit-data, and the second parity.

11. The semiconductor device according to claim 10, wherein the parity calculation logic generates third parity information from I-bit data input received from outside the semiconductor device and (J-I) bit-data selected from the error-corrected J-bit data, in correspondence with the first write command.

12. The semiconductor device according to claim 11, wherein the internal command controller further generates an internal write command that writes the I-bit data input received from outside the semiconductor device and the third parity information in the memory core.

13. The semiconductor device according to claim 2, further comprising:
   a buffer that temporarily stores data output from the error correcting logic.

14. The semiconductor device according to claim 1,
   wherein the data cell region and the parity cell region are logically divided,
   wherein the data cell region is configured to store general data, and
   wherein the parity cell region is configured for storing the parity.

* * * * *